US009123823B2

(12) United States Patent
Shimizu et al.

(10) Patent No.: US 9,123,823 B2
(45) Date of Patent: Sep. 1, 2015

(54) NONVOLATILE SEMICONDUCTOR MEMORY DEVICE

(71) Applicant: Kabushiki Kaisha Toshiba, Minato-ku (JP)

(72) Inventors: Shun Shimizu, Mie-ken (JP); Hiroki Yamashita, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/164,647

(22) Filed: Jan. 27, 2014

(65) Prior Publication Data

US 2015/0060984 A1 Mar. 5, 2015

Related U.S. Application Data

(60) Provisional application No. 61/874,000, filed on Sep. 5, 2013.

(51) Int. Cl.
*H01L 29/788* (2006.01)
*H01L 27/06* (2006.01)
*H01L 27/115* (2006.01)
*H01L 49/02* (2006.01)

(52) U.S. Cl.
CPC ........ *H01L 29/7881* (2013.01); *H01L 27/0629* (2013.01); *H01L 27/11531* (2013.01); *H01L 28/20* (2013.01); *H01L 28/60* (2013.01)

(58) Field of Classification Search
USPC .......... 257/296, 316, 379, 528; 438/266, 424, 438/238
See application file for complete search history.

(56) References Cited

U.S. PATENT DOCUMENTS

| 6,534,867 | B1 | 3/2003 | Kamiya et al. |
| 7,663,178 | B2 | 2/2010 | Arai et al. |
| 7,799,672 | B2 | 9/2010 | Hashimoto et al. |
| 8,772,905 | B2 * | 7/2014 | Meotto et al. .................. 257/528 |
| 2010/0207240 | A1 | 8/2010 | Hashimoto et al. |
| 2011/0156200 | A1 | 6/2011 | Shimura |
| 2012/0049258 | A1 | 3/2012 | Nakahara et al. |
| 2012/0126299 | A1 | 5/2012 | Matsuo et al. |
| 2012/0241835 | A1 | 9/2012 | Sugawara |

FOREIGN PATENT DOCUMENTS

JP 2012-238739 12/2012

* cited by examiner

*Primary Examiner* — Errol Fernandes
(74) *Attorney, Agent, or Firm* — Oblon, McClelland, Maier & Neustadt, L.L.P.

(57) ABSTRACT

According to embodiment, a nonvolatile semiconductor memory device, includes: a memory cell region; and a peripheral region, the memory cell region including: a semiconductor layer including semiconductor regions; control gate electrodes; a first insulating film; a semiconductor-containing layer having a smaller thickness than the first insulating film; and a second insulating film, the peripheral region including: the semiconductor layer; a third insulating film; the semiconductor-containing layer, and a periphery of the semiconductor-containing layer being surrounded by an element isolation region; the first insulating film provided on the semiconductor-containing layer; and a pair of conductive layers extending from a surface of the first insulating film to reach the third insulating film via the semiconductor-containing layer, and the pair of conductive layers being in contact with part of a lower surface of the semiconductor-containing layer.

8 Claims, 13 Drawing Sheets

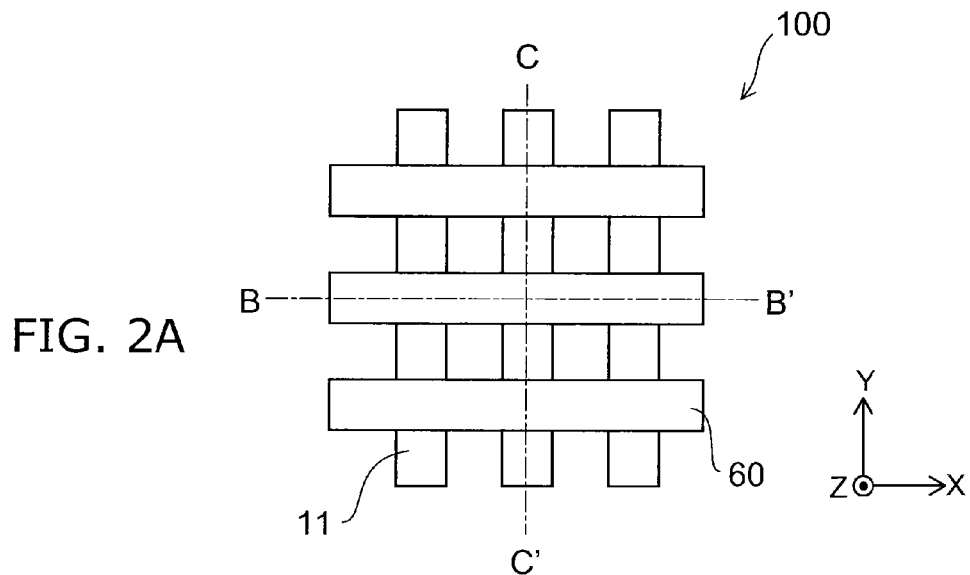
FIG. 2A
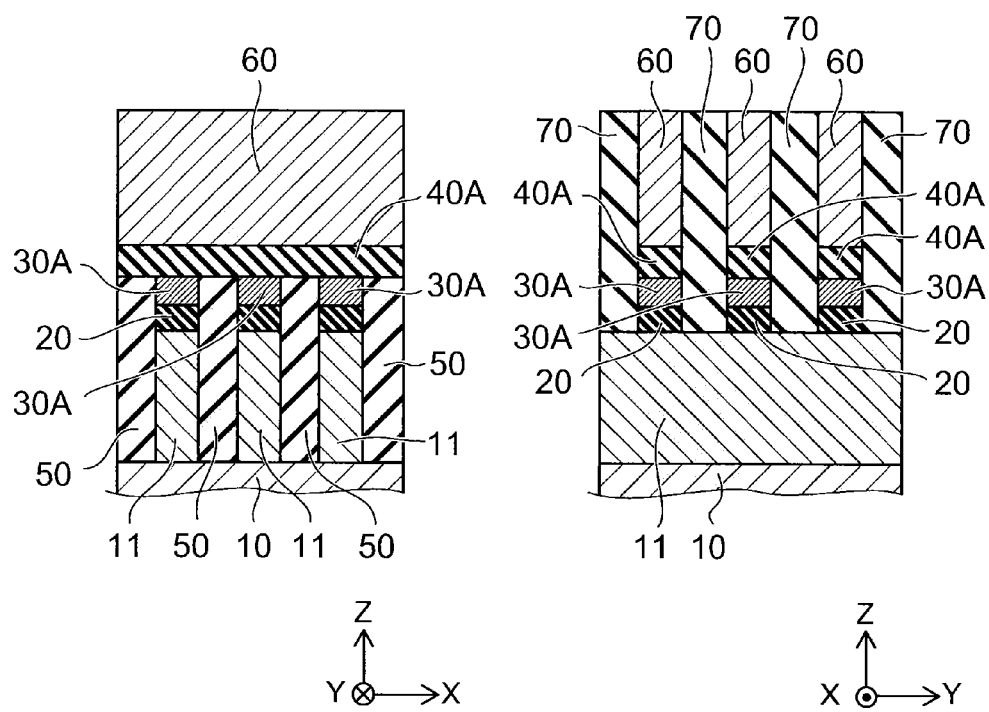
FIG. 2B
FIG. 2C

US 9,123,823 B2

NONVOLATILE SEMICONDUCTOR MEMORY DEVICE

CROSS-REFERENCE TO RELATED APPLICATIONS

This application is based upon and claims the benefit of priority from U.S. Provisional Patent Application 61/874,000, filed on Sep. 5, 2013; the entire contents of which are incorporated herein by reference.

FIELD

Embodiments described herein relate generally to a nonvolatile semiconductor device.

BACKGROUND

A nonvolatile semiconductor memory device includes a memory cell region and a peripheral region disposed at a periphery of the memory cell region. Data information can be stored in the memory cell region. On the other hand, a control circuit for driving the memory cells provided in the memory cell region etc. are provided in the peripheral region.

Elements such as a resistance element and a capacitor may be incorporated into such a circuit. In the nonvolatile semiconductor memory device, layers, electrodes, etc. formed in the memory cell region may be diverted when elements are formed in the peripheral region.

BRIEF DESCRIPTION OF THE DRAWINGS

FIG. 2A is a schematic plan view showing part of the memory cell region of the nonvolatile semiconductor memory device according to the first embodiment, FIG. 2B is a cross-sectional view taken along line B-B' in FIG. 2A, and FIG. 2C is a cross-sectional view taken along line C-C' in FIG. 2A;

DETAILED DESCRIPTION

Figure 1:
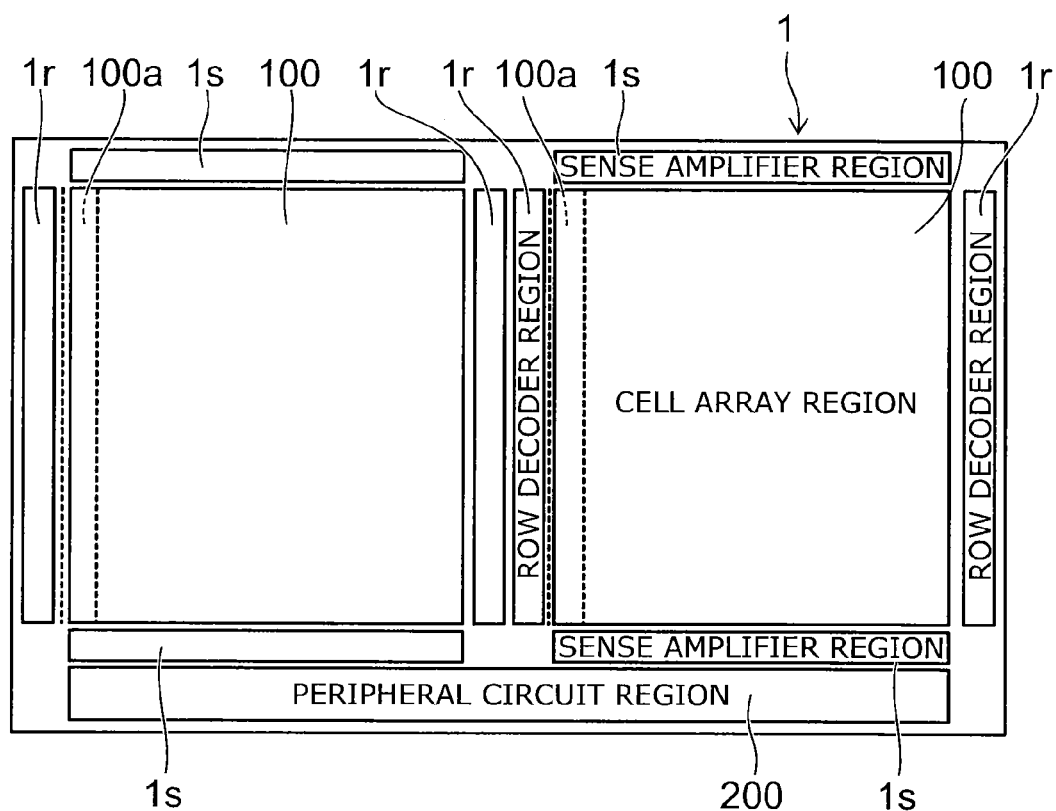
FIG. 1 is a layout showing a nonvolatile semiconductor memory device according to a first embodiment.

In general, according to one embodiment, a nonvolatile semiconductor memory device, includes: a memory cell region; and a peripheral region disposed at a periphery of the memory cell region, the memory cell region including: a semiconductor layer including a plurality of semiconductor regions extending in a first direction, and the semiconductor layer being arranged in a direction crossing the first direction; a plurality of control gate electrodes provided on an upper side of the plurality of semiconductor regions, the control gate electrodes extending in a second direction crossing the first direction, and the control gate electrodes being arranged in a direction crossing the second direction; a first insulating film provided on a lower side of each of the plurality of control gate electrodes, and the first insulating film being in contact with the plurality of control gate electrodes; a semiconductor-containing layer provided at a crossing position of each of the plurality of semiconductor regions and the first insulating film, and the semiconductor-containing layer having a smaller thickness than the first insulating film; and a second insulating film provided between the semiconductor-containing layer and each of the plurality of semiconductor regions, the peripheral region including: the semiconductor layer; a third insulating film provided on the semiconductor layer; the semiconductor-containing layer provided on the third insulating film, and a periphery of the semiconductor-containing layer being surrounded by an element isolation region; the first insulating film provided on the semiconductor-containing layer; and a pair of conductive layers extending from a surface of the first insulating film to reach the third insulating film via the semiconductor-containing layer, and the pair of conductive layers being in contact with part of a lower surface of the semiconductor-containing layer.

Hereinbelow, embodiments are described with reference to the drawings. In the following description, identical components are marked with the same reference numerals, and a description of components once described is omitted as appropriate.

First Embodiment

FIG. 1 is a layout showing a nonvolatile semiconductor memory device according to a first embodiment.

A nonvolatile semiconductor memory device 1 includes a NAND flash memory. In the nonvolatile semiconductor memory device 1, a memory cell region 100, a row-direction end region 100a of the memory cell region 100, a sense amplifier region 1s, a row decoder region 1r, and a peripheral region 200 are disposed. In the embodiment, the sense amplifier region 1s, the row decoder region 1r, and the peripheral region 200 may be collectively referred to as a peripheral region. The peripheral region 200 is disposed at a periphery of the memory cell region 100. In the memory cell region 100, memory strings in each of which select gate transistors are connected to both ends of a column in which a plurality of nonvolatile memory cell transistors 121 are connected in series are arranged in a matrix configuration.

FIG. 2A is a schematic plan view showing part of the memory cell region of the nonvolatile semiconductor memory device according to the first embodiment, FIG. 2B is a cross-sectional view taken along line B-B' in FIG. 2A, and FIG. 2C is a cross-sectional view taken along line C-C' in FIG. 2A.

The memory cell region 100 of the nonvolatile semiconductor memory device 1 includes a semiconductor layer 10, a control gate electrode 60, a block insulating film 40A, a floating gate layer 30A (a semiconductor-containing layer), and a tunnel insulating film 20. The memory cell region 100 has a planar floating gate cell structure.

The semiconductor layer 10 is a layer obtained by fragmenting a semiconductor wafer, for example, and includes a plurality of semiconductor regions 11 on its surface side. The plurality of semiconductor regions 11 extend in the Y-direction (a first direction), and are arranged in a direction crossing the Y-direction. The semiconductor region 11 is a region of the semiconductor layer 10 in which an impurity element is introduced. The semiconductor region 11 is an active area that the transistor of the nonvolatile semiconductor memory device 1 occupies. An element isolation region 50 is provided between adjacent semiconductor regions 11 (FIG. 2B). A diffusion region (a source drain region) is provided in the semiconductor region 11 on both sides of the tunnel insulating film 20 in the Y-direction shown in FIG. 2C (not shown).

A plurality of control gate electrodes 60 are provided on the upper side of the plurality of semiconductor regions 11. The plurality of control gate electrodes 60 extend in the X-direction (a second direction) crossing the Y-direction. The plurality of control gate electrodes 60 are arranged in a direction crossing the X-direction.

The block insulating film 40A is provided on the lower side of each of the plurality of control gate electrodes 60. The block insulating film 40A is in contact with the control gate electrode 60. The block insulating film 40A is provided between the floating gate layer 30A and the control gate electrode 60. The block insulating film 40A extends in the X-direction. The block insulating film 40A is located on the upper side of the upper end of the floating gate layer 30A. The thickness of the block insulating film 40A is 20 nm or less, for example.

The floating gate layer 30A is provided in a position where each of the plurality of semiconductor regions 11 and the block insulating film 40A cross each other. The thickness of the floating gate layer 30A is thinner than the thickness of the block insulating film 40A. The thickness of the floating gate layer 30A is 10 nm or less, for example.

The floating gate layer 30A is provided on the tunnel insulating film 20. The floating gate layer 30A can store a charge that has tunneled from the semiconductor region 11 via the tunnel insulating film 20. The floating gate layer 30A may be referred to as a charge storage layer.

The tunnel insulating film 20 is provided between the floating gate layer 30A and each of the plurality of semiconductor regions 11. The tunnel insulating film 20 allows a charge (e.g. electrons) to tunnel between the semiconductor region 11 and the floating gate layer 30A. The thickness of the tunnel insulating film 20 is 10 nm or less, for example.

The control gate electrode 60 covers the floating gate layer 30A via the block insulating film 40A. The control gate electrode 60 is provided on the upper side of the block insulating film 40A. The control gate electrode 60 functions as a gate electrode for controlling the transistor. The thickness of the control gate electrode 60 is 60 nm or less, for example.

In the case where a stacked body including the tunnel insulating film 20, the floating gate layer 30A, the block insulating film 40A, and the control gate electrode 60 is used as a memory cell, an insulating layer 70 is provided between adjacent memory cells. In other words, the upper surface and the side surface of the floating gate layer 30A are covered with the block insulating film 40A, the tunnel insulating film 20, and the insulating layer 70, and the charge stored in the floating gate layer 30A is prevented from leaking to the control gate electrode 60 and the semiconductor region 11.

Figure 3A:
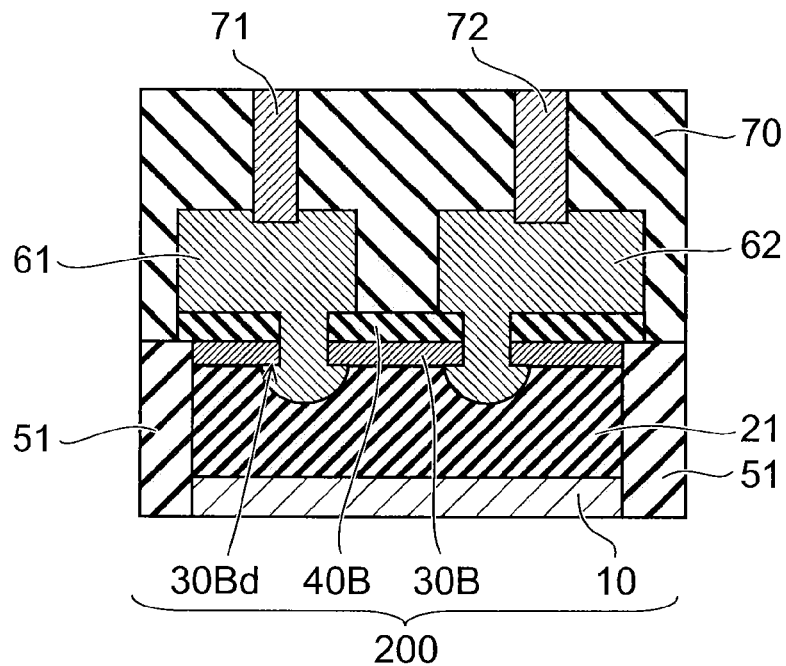
FIG. 3A is a schematic cross-sectional view showing a resistance element provided in the peripheral region of the nonvolatile semiconductor memory device according to the first embodiment.
Figure 3B:
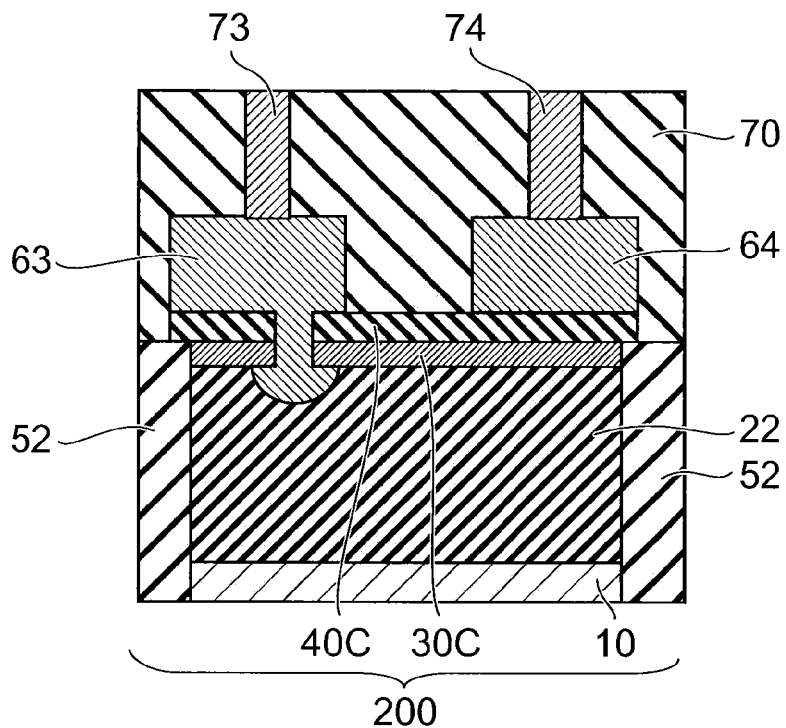
FIG. 3B is a schematic cross-sectional view showing a capacitor provided in the peripheral region of the nonvolatile semiconductor memory device according to the first embodiment.

FIG. 3A is a schematic cross-sectional view showing a resistance element provided in the peripheral region of the nonvolatile semiconductor memory device according to the first embodiment, and FIG. 3B is a schematic cross-sectional view showing a capacitor provided in the peripheral region of the nonvolatile semiconductor memory device according to the first embodiment.

In the peripheral region 200 shown in FIG. 3A, an insulating film 21 is provided on the semiconductor layer 10. The components and configuration of the insulating film 21 may be the same as the components and configuration of the tunnel insulating film 20, for example.

A semiconductor-containing layer 30B is provided on the insulating film 21. The semiconductor-containing layer 30B can be formed simultaneously with the floating gate layer 30A in the memory cell region 100 by the same manufacturing process. In this case, the components of the semiconductor-containing layer 30B are the same as the components of the floating gate layer 30A. Furthermore, the thickness of the semiconductor-containing layer 30B is the same as the thickness of the floating gate layer 30A.

The periphery of the semiconductor-containing layer 30B is surrounded by an element isolation region 51. The semiconductor-containing layer 30B is insulated from the semiconductor layer 10 by the element isolation region 51. The element isolation region 51 further surrounds the periphery of the insulating film 21 on the lower side of the semiconductor-containing layer 30B.

An insulating film 40B is provided on the semiconductor-containing layer 30B. The insulating film 40B can be formed simultaneously with the block insulating film 40A in the memory cell region 100 by the same manufacturing process. In this case, the components of the insulating film 40B are the same as the components of the block insulating film 40A. Furthermore, the thickness of the insulating film 40B is the same as the thickness of the block insulating film 40A.

In the peripheral region 200 shown in FIG. 3A, a pair of conductive layers 61 and 62 that extend from the surface of the insulating film 40B to reach the insulating film 21 via the semiconductor-containing layer 30B are provided. Each of the conductive layers 61 and 62 wraps around to the lower side of the semiconductor-containing layer 30B, and is in contact with part of the lower surface 30Bd of the semiconductor-containing layer 30B.

Each of the conductive layers 61 and 62 can be formed simultaneously with the control gate electrode 60 in the memory cell region 100 by the same manufacturing process. In this case, the components and configuration of each of the conductive layers 61 and 62 are the same as the components and configuration of the control gate electrode 60, for example.

A contact electrode 71 is connected to the conductive layer 61. A contact electrode 72 is connected to the conductive layer 62. The conductive layers 61 and 62, the contact electrodes 71 and 72, and the insulating film 40B are covered with the insulating layer 70.

In the peripheral region 200 shown in FIG. 3A, the semiconductor-containing layer 30B connecting the conductive layer 61 and the conductive layer 62 forms a resistance element.

The thickness of the insulating film 21 may be thicker than the thickness of the tunnel insulating film 20. The film thickness of the insulating film 21 is adjusted to such a film thickness that dielectric breakdown does not occur between the conductive layer 61 and the semiconductor layer 10 when a prescribed voltage is applied between the conductive layer 61 and the semiconductor layer 10, or dielectric breakdown does not occur between the conductive layer 62 and the semiconductor layer 10 when a prescribed voltage is applied between the conductive layer 62 and the semiconductor layer 10, for example. The thickness of the insulating film 21 is 50 nm or less, for example.

In the peripheral region 200 shown in FIG. 3B, an insulating film 22 is provided on the semiconductor layer 10. A semiconductor-containing layer 30C is provided on the insulating film 22. The periphery of the semiconductor-containing layer 30C is surrounded by an element isolation region 52. The element isolation region 52 surrounds the periphery of the insulating film 22 on the lower side of the semiconductor-containing layer 30C.

The semiconductor-containing layer 30C can be formed simultaneously with the floating gate layer 30A in the memory cell region 100 by the same manufacturing process. In this case, the components of the semiconductor-containing layer 30C are the same as the components of the floating gate layer 30A. Furthermore, the thickness of the semiconductor-containing layer 30C is the same as the thickness of the floating gate layer 30A.

An insulating film 40C is provided on the semiconductor-containing layer 30C. The insulating film 40C can be formed simultaneously with the block insulating film 40A in the memory cell region 100 by the same manufacturing process. In this case, the components of the insulating film 40C are the same as the components of the block insulating film 40A. Furthermore, the thickness of the insulating film 40C is the same as the thickness of the block insulating film 40A.

In the peripheral region 200 shown in FIG. 3B, a conductive layer 63 extends from the surface of the insulating film 40C to reach the insulating film 22 via the semiconductor-containing layer 30C. The conductive layer 63 wraps around to the lower side of the semiconductor-containing layer 30C, and is in contact with part of the lower surface 30Cd of the semiconductor-containing layer 30C. A conductive layer 64 is provided on the semiconductor-containing layer 30C via the insulating film 40C.

Each of the conductive layers 63 and 64 can be formed simultaneously with the control gate electrode 60 in the memory cell region 100 by the same manufacturing process. In this case, the components and configuration of each of the conductive layers 63 and 64 are the same as the components and configuration of the control gate electrode 60, for example.

A contact electrode 73 is connected to the conductive layer 63. A contact electrode 74 is connected to the conductive layer 64. The conductive layers 63 and 64, the contact electrodes 73 and 74, and the insulating film 40C are covered with the insulating layer 70.

In the peripheral region 200 shown in FIG. 3B, the semiconductor-containing layer 30C, the conductive layer 64, and the insulating film 40C sandwiched by the semiconductor-containing layer 30C and the conductive layer 64 form a capacitor.

The thickness of the insulating film 22 may be still thicker than the thickness of the insulating film 21. The film thickness of the insulating film 22 is adjusted to such a film thickness that dielectric breakdown does not occur between the conductive layer 63 and the semiconductor layer 10 when a prescribed voltage is applied between the conductive layer 63 and the semiconductor layer 10, for example.

When using the capacitor mentioned above, there is a case where a voltage higher than the voltage applied between the conductive layer 61 and the semiconductor layer 10 or between the conductive layer 62 and the semiconductor layer 10 is applied between the conductive layer 63 and the semiconductor layer 10 or between the conductive layer 64 and the semiconductor layer 10. Even in such a case, sufficient insulation is maintained between the conductive layer 63 and the semiconductor layer 10 by setting the thickness of the insulating film 22 thicker than the thickness of the insulating film 21.

The material of the semiconductor layer 10 (or the semiconductor region 11) is a silicon crystal, for example. The material of the tunnel insulating film 20 and the insulating films 21 and 22 is silicon oxide ($SiO_x$), for example.

The material of the floating gate layer 30A and the semiconductor-containing layers 30B and 30C is polysilicon (poly-Si) or the like.

The block insulating film 40A and the insulating films 40B and 40C are a single-layer film containing one of an oxide containing at least one of silicon (Si), aluminum (Al), hafnium (Hf), zirconium (Zr), tantalum (Ta), and lanthanum (La), a nitride containing at least one of Si, Al, Hf, Zr, Ta, and La, and an oxynitride containing at least one of Si, Al, Hf, Zr, Ta, and La, or a stacked film in which at least two of the single-layer film containing an oxide mentioned above, the single-layer film containing a nitride mentioned above, and the single-layer film containing an oxynitride mentioned above are stacked.

The material of the control gate electrode 60 and the conductive layers 61 to 64 is tungsten, tungsten nitride, or the like, for example.

In the embodiment, the material of portions referred to as element isolation regions, insulating films, or insulating layers is silicon oxide ($SiO_2$), for example.

FIG. 4A to FIG. 5B are schematic cross-sectional views showing the manufacturing process of forming a resistance element in the peripheral region according to the first embodiment.

Figure 4A:
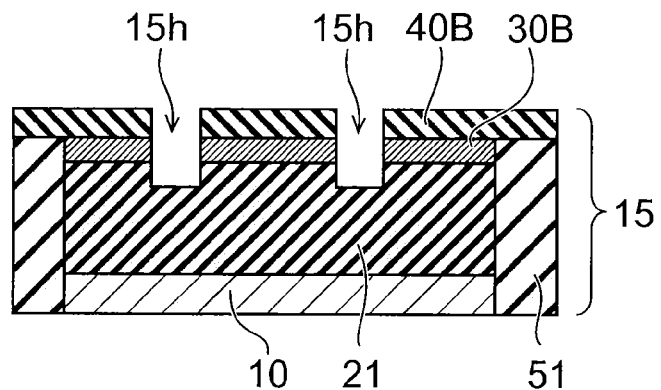
FIG. 4A to FIG. 5B are schematic cross-sectional views showing the manufacturing process of forming a resistance element in the peripheral region according to the first embodiment.

First, as shown in FIG. 4A, a stacked body 15 in which the insulating film 21 is provided on the semiconductor layer 10, the semiconductor-containing layer 30B is provided on the insulating film 21, and the insulating film 40B is provided on the semiconductor-containing layer 30B is prepared. Here, the thickness of the insulating film 21 may be formed thicker than the thickness of the tunnel insulating film 20. The element isolation region 51 that surrounds the periphery of the semiconductor-containing layer 30B is formed.

Subsequently, photolithography and RIE (reactive ion etching) processing are performed on the stacked body 15 to form a pair of contact holes 15*h* extending from the surface of the insulating film 40B to the insulating film 21.

Figure 4B:
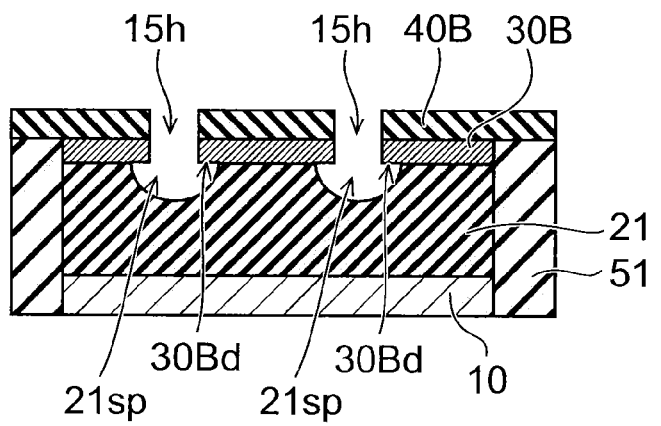

Next, as shown in FIG. 4B, a wet etching solution is introduced into the pair of contact holes 15*h* to perform isotropic etching on the surface of the insulating film 21 exposed at the contact holes 15*h*. Here, as the etching solution, a solution whereby the etching rate of the insulating film 21 is higher than the etching rate of the semiconductor-containing layer 30B and the insulating film 40B is selected. For example, a dilute hydrofluoric acid solution is used as the solution.

By the wet etching, the surface of the insulating film 21 exposed at the contact hole 15h is selectively removed, and a space 21sp leading to the contact hole 15h is formed on the lower side of the semiconductor-containing layer 30B. The space 21sp has a wider width than the contact hole 15h. Here, the width according to the embodiment is defined by the width in a direction parallel to the major surface of the semiconductor layer 10, for example. In the space 21sp, part of the lower surface 30Bd of the semiconductor-containing layer 30B is exposed.

Figure 4C:
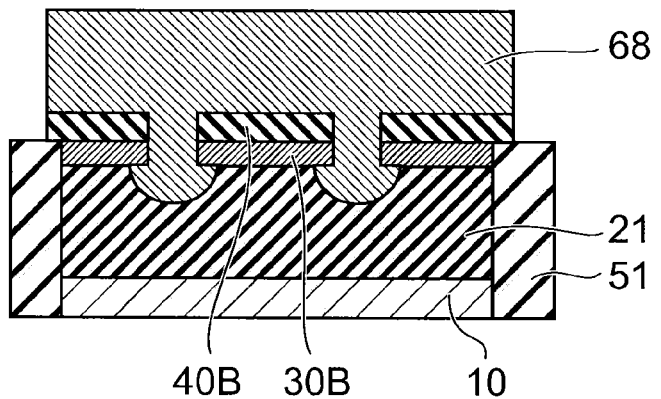

Next, as shown in FIG. 4C, a conductive layer 68 is formed on the insulating film 40B, in the contact hole 15h, and in the space 21sp. The formation of the conductive layer 68 is performed by CVD (chemical vapor deposition) with good step coatability. The components of the conductive layer 68 are the same as the components of the conductive layers 61 and 62 described above.

Figure 5A:
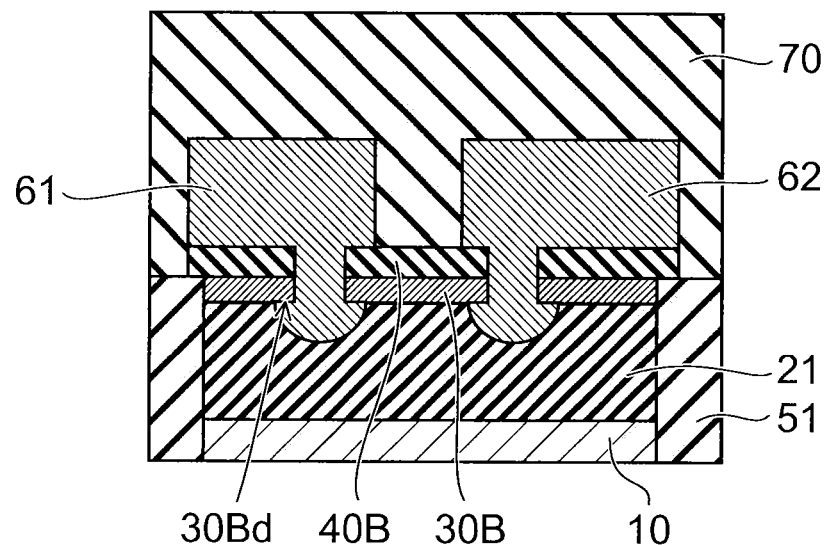

Next, as shown in FIG. 5A, photolithography and RIE processing are performed on the conductive layer 68 to separate the conductive layer 68 into the conductive layer 61 and the conductive layer 62. In this stage, the conductive layers 61 and 62 that wrap around to the lower side of the semiconductor-containing layer 30B and reach part of the lower surface 30Bd of the semiconductor-containing layer 30B are formed. Subsequently, the insulating layer 70 that covers the conductive layers 61 and 62 is formed by CVD.

Figure 5B:
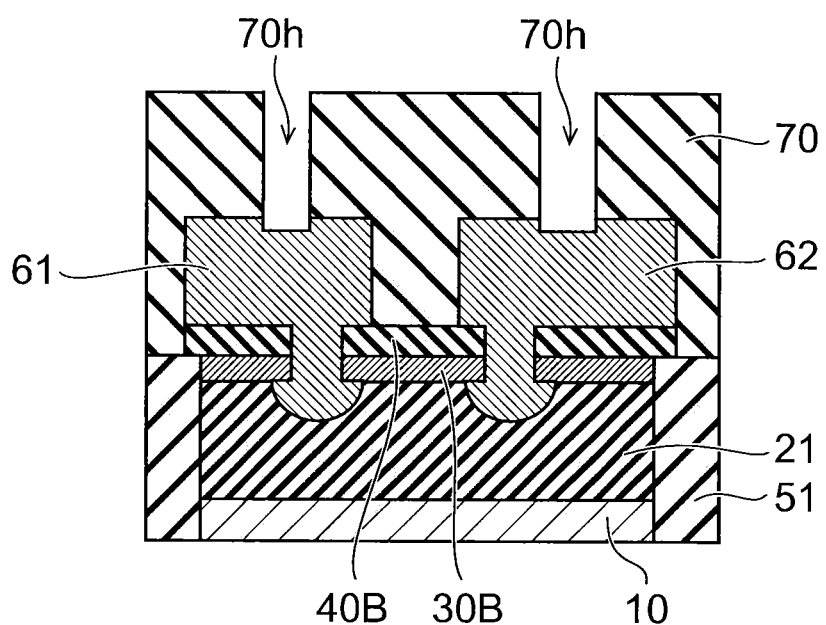

Next, as shown in FIG. 5B, photolithography and RIE are performed on the insulating layer 70, and a contact hole 70h that exposes part of each of the conductive layers 61 and 62 is formed in the insulating layer 70. After that, as shown in FIG. 3A, the contact electrodes 71 and 72 are formed in the contact holes 70h. Through such manufacturing processes, a resistance element is formed in the peripheral region 200.

FIG. 6A to FIG. 7B are schematic cross-sectional views showing the manufacturing process of forming a capacitor in the peripheral region according to the first embodiment.

Figure 6A:
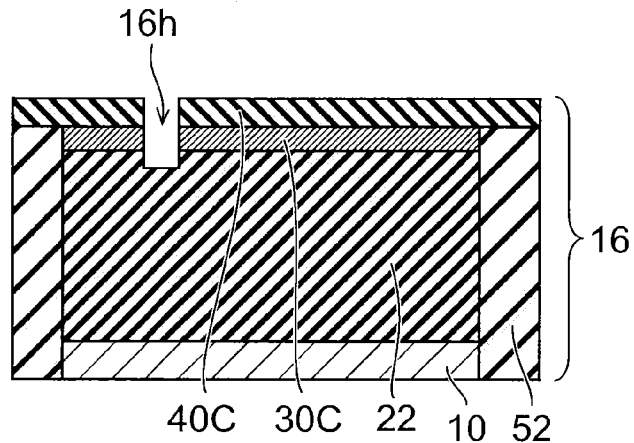
FIG. 6A to FIG. 7B are schematic cross-sectional views showing the manufacturing process of forming a capacitor in the peripheral region according to the first embodiment.

First, as shown in FIG. 6A, a stacked body 16 in which the insulating film 22 is provided on the semiconductor layer 10, the semiconductor-containing layer 30C is provided on the insulating film 22, and the insulating film 40C is provided on the semiconductor-containing layer 30C is prepared. Here, the thickness of the insulating film 22 may be formed thicker than the thickness of the insulating film 21. The element isolation region 52 that surrounds the periphery of the semiconductor-containing layer 30C is formed.

Subsequently, photolithography and RIE processing are performed on the stacked body 16 to form a contact hole 16h extending from the surface of the insulating film 40C to the insulating film 22.

Figure 6B:
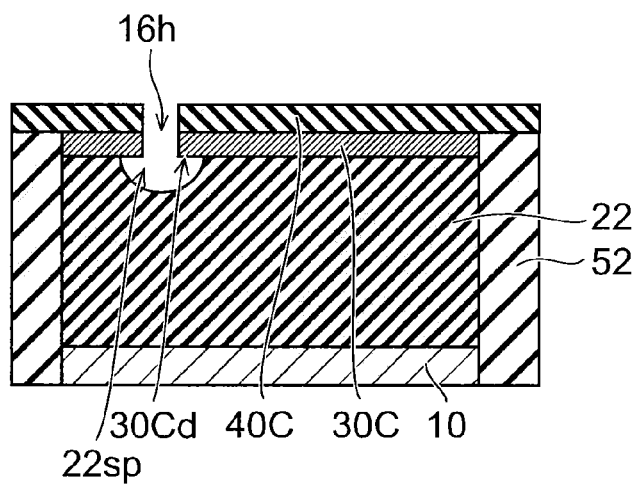

Next, as shown in FIG. 6B, a wet etching solution is introduced into the contact hole 16h to perform isotropic etching on the surface of the insulating film 22 exposed at the contact hole 16h. Here, a dilute hydrofluoric acid solution is used as the etching solution.

By the wet etching, the surface of the insulating film 22 exposed at the contact hole 16h is selectively etched, and a space 22sp leading to the contact hole 16h is formed on the lower side of the semiconductor-containing layer 30C. The space 22sp has a wider width than the contact hole 16h. In the space 22sp, part of the lower surface 30Cd of the semiconductor-containing layer 30C is exposed.

Figure 6C:
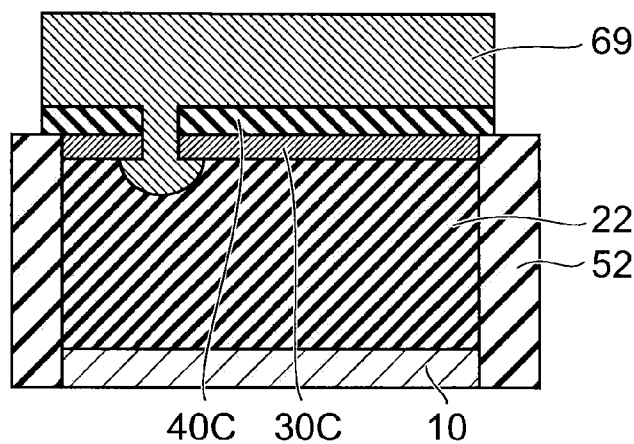

Next, as shown in FIG. 6C, a conductive layer 69 is formed on the insulating film 40C, in the contact hole 16h, and in the space 22sp. The formation of the conductive layer 69 is performed by CVD. The components of the conductive layer 69 are the same as the components of the conductive layers 63 and 64 described above.

Figure 7A:
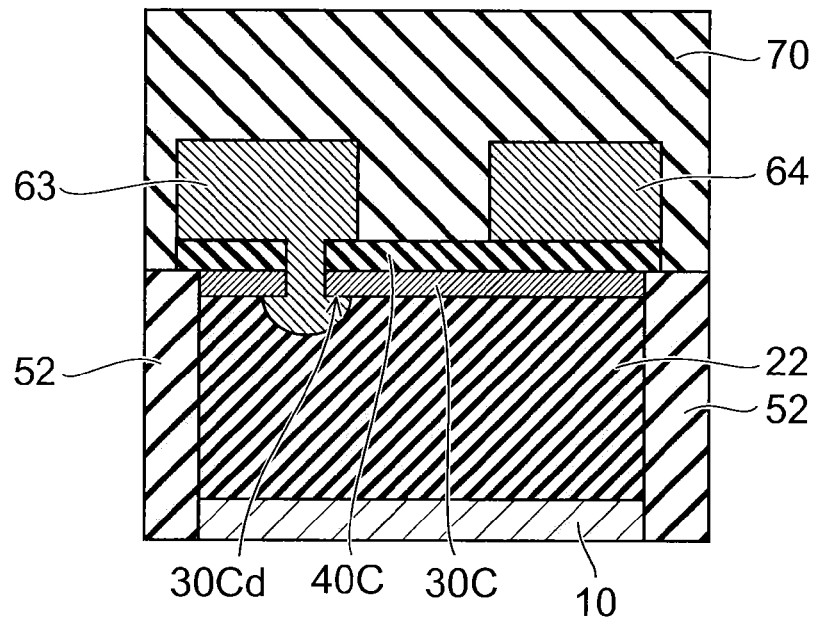

Next, as shown in FIG. 7A, photolithography and RIE processing are performed on the conductive layer 69 to separate the conductive layer 69 into the conductive layer 63 and the conductive layer 64. In this stage, the conductive layer 63 that wraps around to the lower side of the semiconductor-containing layer 30C and reaches part of the lower surface 30Cd of the semiconductor-containing layer 30C is formed. Subsequently, the insulating layer 70 that covers the conductive layers 63 and 64 is formed by CVD.

Figure 7B:
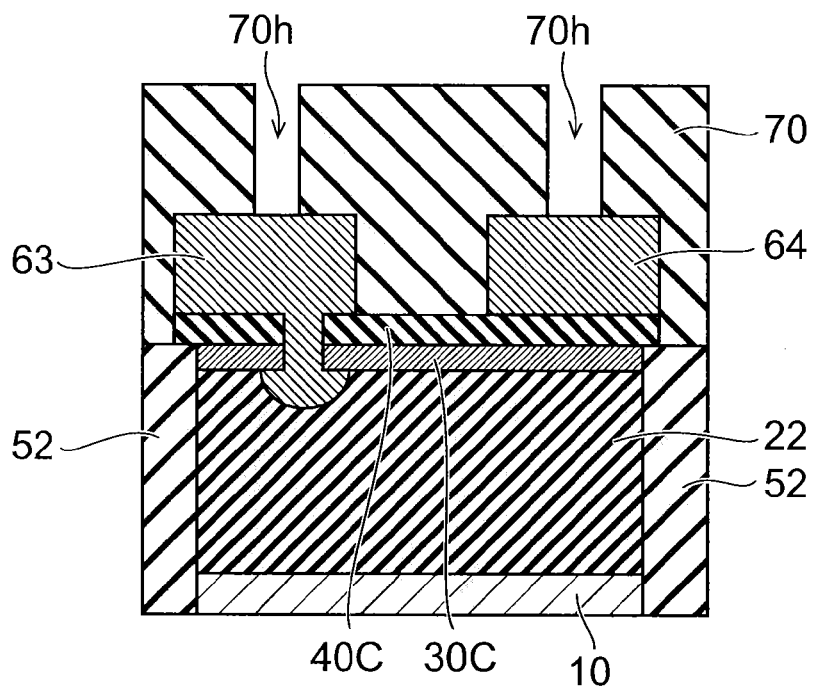

Next, as shown in FIG. 7B, photolithography and RIE are performed on the insulating layer 70, and a contact hole 70h that exposes part of each of the conductive layers 63 and 64 is formed in the insulating layer 70. After that, as shown in FIG. 3B, the contact electrodes 73 and 74 are formed in the contact holes 70h. Through such manufacturing processes, a capacitor is formed in the peripheral region 200.

Before effects of the first embodiment are described, a resistance element and a capacitor in the peripheral region according to a reference example are described.

Figure 8A:
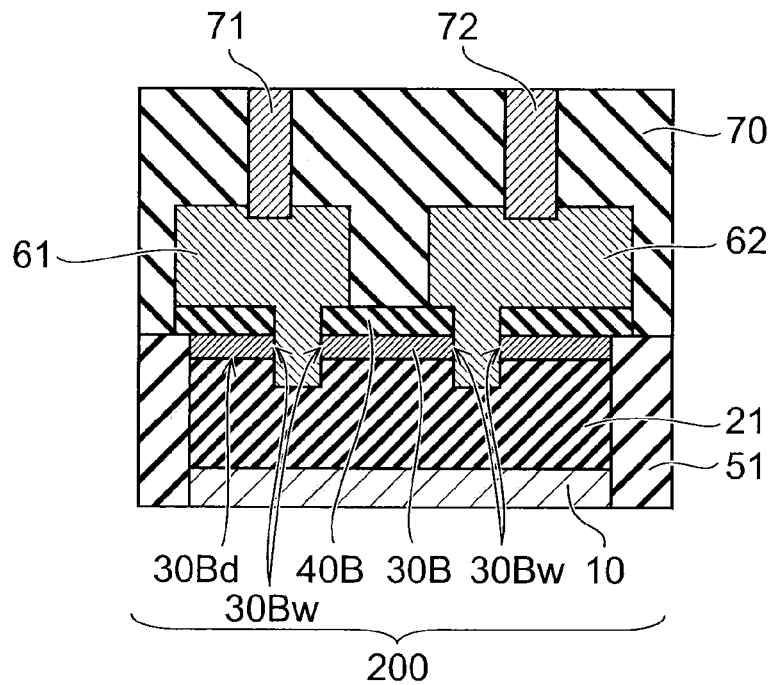
FIG. 8A is a schematic cross-sectional view showing a resistance element provided in the peripheral region of a nonvolatile semiconductor memory device according to the reference example.
Figure 8B:
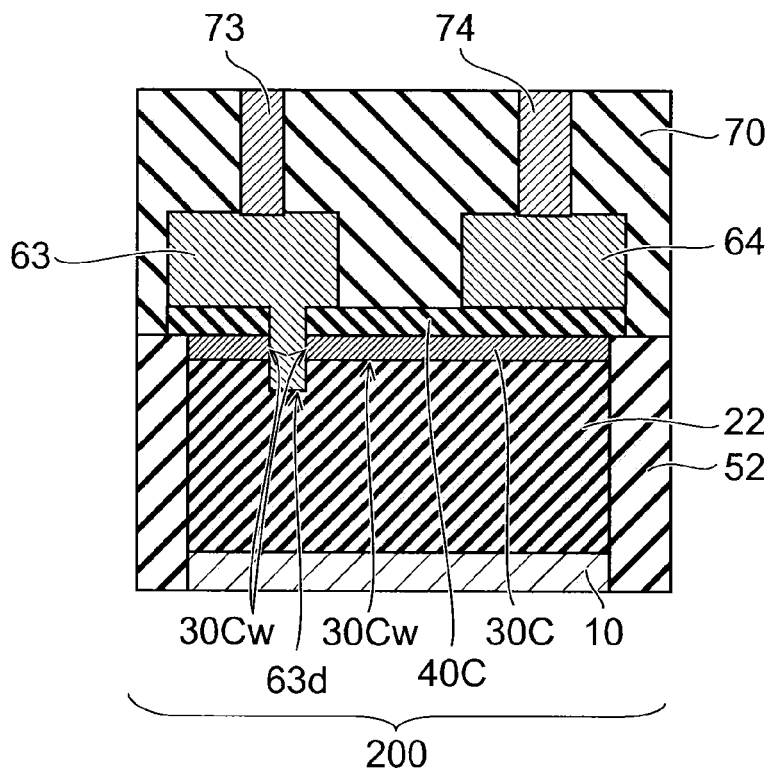
FIG. 8B is a schematic cross-sectional view showing a capacitor provided in the peripheral region of the nonvolatile semiconductor memory device according to the reference example.

FIG. 8A is a schematic cross-sectional view showing a resistance element provided in the peripheral region of a nonvolatile semiconductor memory device according to the reference example, and FIG. 8B is a schematic cross-sectional view showing a capacitor provided in the peripheral region of the nonvolatile semiconductor memory device according to the reference example.

In the peripheral region 200 shown in FIG. 8A, the process of forming the space 21sp described above is not experienced. Therefore, in the reference example, the conductive layers 61 and 62 do not wrap around to the lower surface 30Bd of the semiconductor-containing layer 30B, and the conductive layers 61 and 62 are in contact only with the side wall 30Bw of the semiconductor-containing layer 30B.

As described above, in the case where the semiconductor-containing layer 30B is formed simultaneously with the floating gate layer 30A in the memory cell region 100, the thickness of the semiconductor-containing layer 30B is 10 nm or less. Therefore, in the resistance element according to the reference example, the contact area between the conductive layer 61 and the semiconductor-containing layer 30B and the contact area between the conductive layer 62 and the semiconductor-containing layer 30B are very small. Thus, in the resistance element according to the reference example, there are limitations to reducing the contact resistance between the conductive layer 61 and the semiconductor-containing layer 30B and the contact resistance between the conductive layer 62 and the semiconductor-containing layer 30B.

Also in the peripheral region 200 shown in FIG. 8B, the process of forming the space 22sp described above is not experienced. Furthermore, the thickness of the insulating film 22 is the same as the thickness of the insulating film 21. Therefore, the conductive layer 63 does not wrap around to the lower surface 30Cd of the semiconductor-containing layer 30C, and the conductive layer 63 is in contact only with the side wall 30Cw of the semiconductor-containing layer 30C.

As described above, in the case where the semiconductor-containing layer 30C is formed simultaneously with the floating gate layer 30A in the memory cell region 100, the thickness of the semiconductor-containing layer 30C is 10 nm or less. Therefore, in the capacitor according to the reference example, the contact area between the conductive layer 63 and the semiconductor-containing layer 30C is very small. Thus, in the capacitor according to the reference example, there are limitations to reducing the contact resistance between the conductive layer 63 and the semiconductor-containing layer 30C.

On the other hand, since the thickness of the semiconductor-containing layer 30C is 10 nm or less, the bottom of the contact hole for burying the conductive layer 63 may pierce the semiconductor-containing layer 30C to the lower side. In such a case, the lower end 63d of the conductive layer 63 is located on the lower side of the semiconductor-containing layer 30C. Therefore, the lower end 63d of the conductive layer 63 may come close to the semiconductor layer 10 to cause dielectric breakdown between the conductive layer 63 and the semiconductor layer 10.

Thus, in the reference example, for example, RC delay is likely to occur due to the increase in the contact resistance mentioned above.

In contrast, in the peripheral region 200 according to the first embodiment, the process of forming the space 21sp described above is experienced. Thus, the conductive layers 61 and 62 wrap around to the lower surface 30Bd of the semiconductor-containing layer 30B, and the conductive layers 61 and 62 are in contact not only with the side wall 30Bw of the semiconductor-containing layer 30B but also with the lower surface 30Bd of the semiconductor-containing layer 30B.

Therefore, in the resistance element according to the first embodiment, the contact area between the conductive layer 61 and the semiconductor-containing layer 30B and the contact area between the conductive layer 62 and the semiconductor-containing layer 30B are larger than those of the reference example. In the resistance element according to the first embodiment, the contact resistance between the conductive layer 61 and the semiconductor-containing layer 30B and the contact resistance between the conductive layer 62 and the semiconductor-containing layer 30B can be made lower than those of the reference example.

Furthermore, in the peripheral region 200 according to the first embodiment, the process of forming the space 22sp described above is experienced. Thus, the conductive layer 63 wraps around to the lower surface 30Cd of the semiconductor-containing layer 30C, and the conductive layer 63 is in contact not only with the side wall 30Cw of the semiconductor-containing layer 30C but also with the lower surface 30Cd of the semiconductor-containing layer 30C.

Therefore, in the capacitor according to the first embodiment, the contact area between the conductive layer 63 and the semiconductor-containing layer 30C is larger than that of the reference example. Thereby, in the capacitor according to the first embodiment, the contact resistance between the conductive layer 63 and the semiconductor-containing layer 30C can be made lower than that of the reference example. In other words, in the first embodiment, for example, RC delay is suppressed by the reduction in the contact resistance mentioned above.

The thickness of the insulating film 22 is thicker than the thickness of the insulating film 21. Therefore, even if the conductive layer 63 is buried in the space 22sp, the thickness of the insulating film between the conductive layer 63 and the semiconductor layer 10 is thicker than that of the reference example because the insulating film 22 is formed thicker than the thickness of the insulating film 21. Thereby, in the first embodiment, dielectric breakdown is less likely to occur between the conductive layer 63 and the semiconductor layer 10.

Second Embodiment

The resistance element and the capacitor in the peripheral region 200 are not limited to the structures of the first embodiment.

Figure 9A:
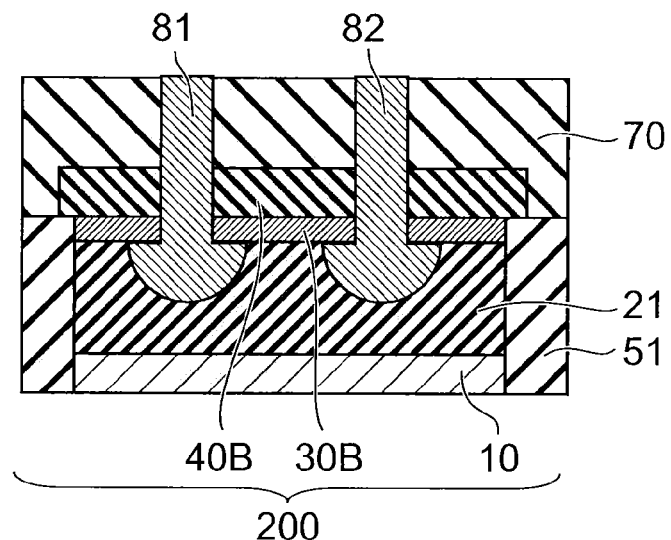
FIG. 9A is a schematic cross-sectional view showing a resistance element provided in the peripheral region of a nonvolatile semiconductor memory device according to a second embodiment.
Figure 9B:
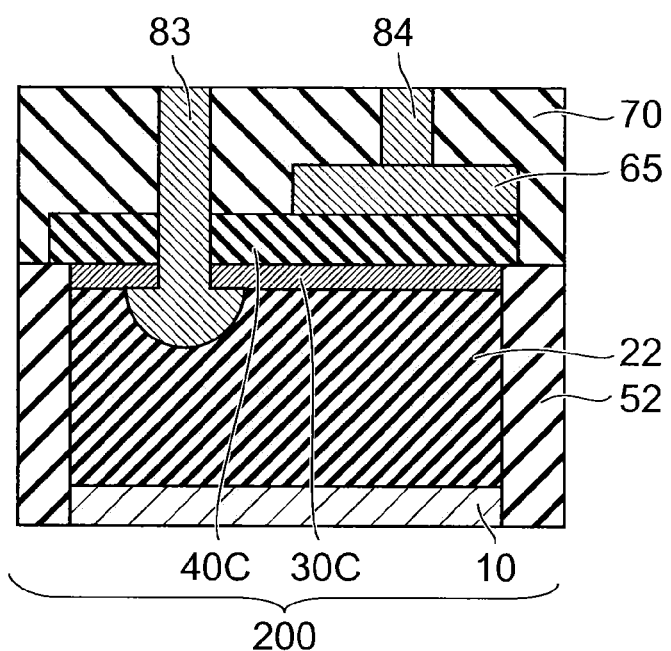
FIG. 9B is a schematic cross-sectional view showing a capacitor provided in the peripheral region of the nonvolatile semiconductor memory device according to the second embodiment.

FIG. 9A is a schematic cross-sectional view showing a resistance element provided in the peripheral region of a nonvolatile semiconductor memory device according to a second embodiment, and FIG. 9B is a schematic cross-sectional view showing a capacitor provided in the peripheral region of the nonvolatile semiconductor memory device according to the second embodiment.

As shown in FIG. 9A, the insulating film 21 is provided on the semiconductor layer 10. The semiconductor-containing layer 30B is provided on the insulating film 21. The semiconductor-containing layer 30B is a resistance element. The periphery of the semiconductor-containing layer 30B is surrounded by the element isolation region 51. The semiconductor-containing layer 30B is insulated from the semiconductor layer 10 by the element isolation region 51. The element isolation region 51 further surrounds the periphery of the insulating film 21 on the lower side of the semiconductor-containing layer 30B. The insulating film 40B is provided on the semiconductor-containing layer 30B.

As shown in FIG. 9A, a pair of conductive layers 81 and 82 that extend from the surface of the insulating film 40B to reach the insulating film 21 via the semiconductor-containing layer 30B are provided. Each of the conductive layers 81 and 82 wraps around to the lower side of the semiconductor-containing layer 30B, and is in contact with part of the lower surface 30Bd of the semiconductor-containing layer 30B. The conductive layers 81 and 82 and the insulating film 40B are covered with the insulating layer 70.

As shown in FIG. 9B, the insulating film 22 is provided on the semiconductor layer 10. The semiconductor-containing layer 30C is provided on the insulating film 22. The periphery of the semiconductor-containing layer 30C is surrounded by the element isolation region 52. The element isolation region 52 surrounds the periphery of the insulating film 22 on the lower side of the semiconductor-containing layer 30C.

The insulating film 40C is provided on the semiconductor-containing layer 30C. As shown in FIG. 9B, a conductive layer 83 extends from the surface of the insulating film 40C to reach the insulating film 22 via the semiconductor-containing layer 30C. The conductive layer 83 wraps around to the lower side of the semiconductor-containing layer 30C, and is in contact with part of the lower surface 30Cd of the semiconductor-containing layer 30C. Conductive layers 65 and 84 are provided on the semiconductor-containing layer 30C via the insulating film 40C. The conductive layers 83, 84, and 65 and the insulating film 40C are covered with the insulating layer 70.

In the peripheral region 200 shown in FIG. 9B, the semiconductor-containing layer 30C, the conductive layer 65, and the insulating film 40C sandwiched by the semiconductor-containing layer 30C and the conductive layer 65 form a capacitor.

The thickness of the insulating film 22 may be still thicker than the thickness of the insulating film 21. FIG. 9B illustrates this state as an example. As described above, when using the capacitor mentioned above, there is a case where a voltage higher than the voltage applied between the conductive layer 81 and the semiconductor layer 10 or between the conductive layer 82 and the semiconductor layer 10 is applied between the conductive layer 65 and the semiconductor layer 10 or between the conductive layer 83 and the semiconductor layer 10. In such a case, sufficient insulation is maintained between each of the conductive layers 65 and 82 and the semiconductor layer 10 by setting the thickness of the insulating film 22 thicker than the thickness of the insulating film 21.

FIG. 10A to FIG. 11B are schematic cross-sectional views showing the manufacturing process of forming a resistance element in the peripheral region according to the second embodiment.

Figure 10A:
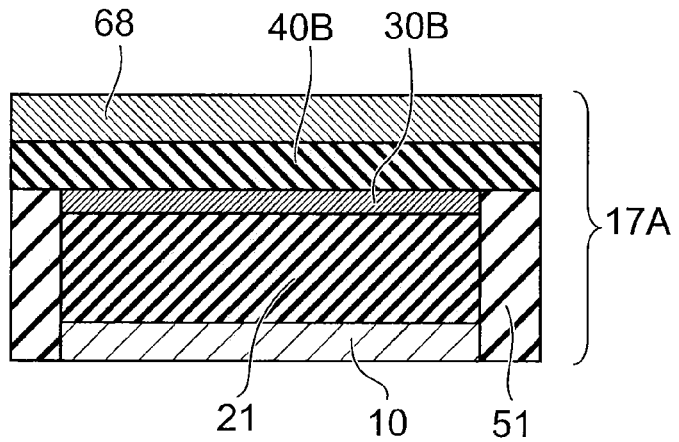
FIG. 10A to FIG. 11B are schematic cross-sectional views showing the manufacturing process of forming a resistance element in the peripheral region according to the second embodiment.

First, as shown in FIG. 10A, after the semiconductor layer 10, the insulating film 21, and the semiconductor-containing layer 30B surrounded by the element isolation region 51 are formed beforehand, the insulating film 40B is formed on the element isolation region 51 and on the semiconductor-containing layer 30B, and the conductive layer 68 is formed on the insulating film 40B. The structure in which the semiconductor layer 10, the insulating film 21, the semiconductor-containing layer 30B, the insulating film 40B, and the conductive layer 68 are stacked in this order is referred to as a stacked body 17A.

The thickness of the insulating film 21 may be formed thicker than the thickness of the tunnel insulating film 20.

Figure 10B:
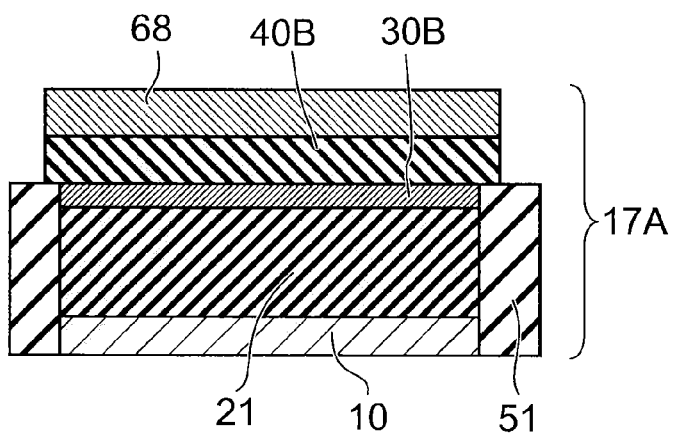

Next, as shown in FIG. 10B, photolithography and RIE processing are performed on the stacked body 17A to such a degree that the width of the conductive layer 68 and the width of the insulating film 40B are almost the same as the width of the semiconductor-containing layer 30B.

Figure 10C:
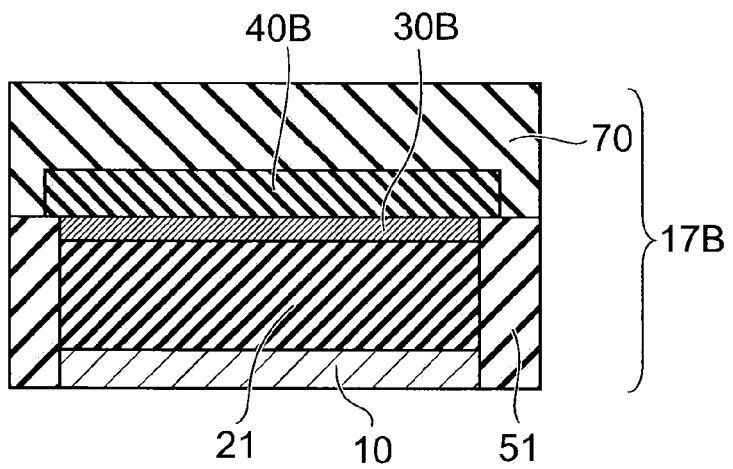

Next, as shown in FIG. 10C, the conductive layer 68 is removed from the stacked body 17A, and the insulating layer 70 that covers the element isolation region 51 and the insulating film 40B is formed. The structure in which the semiconductor layer 10, the insulating film 21, the semiconductor-containing layer 30B, the insulating film 40B, and the insulating layer 70 are stacked in this order is referred to as a stacked body 17B.

Figure 11A:
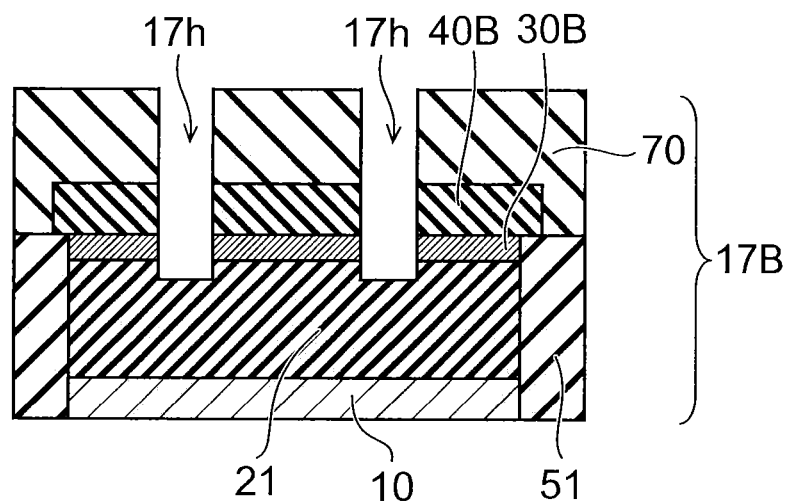

Next, as shown in FIG. 11A, photolithography and RIE processing are performed on the stacked body 17B to form a pair of contact holes 17h extending from the surface of the insulating layer 70 to the insulating film 21.

Figure 11B:
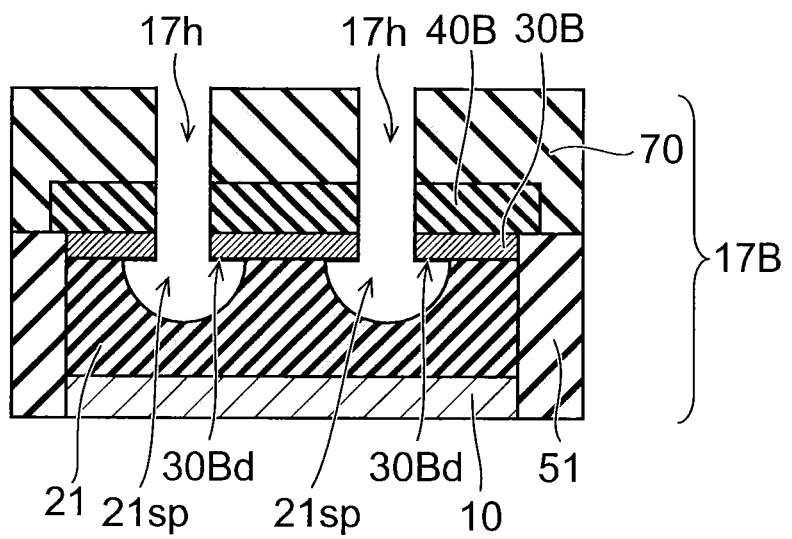

Next, as shown in FIG. 11B, a wet etching solution is introduced into the pair of contact holes 17h to perform isotropic etching on the surface of the insulating film 21 exposed at the contact holes 17h. Here, as the etching solution, a solution whereby the etching rate of the insulating film 21 is higher than the etching rate of the semiconductor-containing layer 30B and the insulating film 40B is selected. For example, a dilute hydrofluoric acid solution is used as the solution.

By the wet etching, the surface of the insulating film 21 exposed at the contact hole 17h is selectively removed, and a space 21sp leading to the contact hole 17h is formed on the lower side of the semiconductor-containing layer 30B. The space 21sp has a wider width than the contact hole 15h. In the space 21sp, part of the lower surface 30Bd of the semiconductor-containing layer 30B is exposed.

After that, as shown in FIG. 9A, the conductive layers 81 and 82 are formed in the contact holes 17h and in the spaces 21sp. The formation of the conductive layers 81 and 82 is performed by CVD with good step coatability. The component of the conductive layers 81 and 82 is tungsten, for example.

FIG. 12A to FIG. 13C are schematic cross-sectional views showing the manufacturing process of forming a capacitor in the peripheral region according to the second embodiment.

Figure 12A:
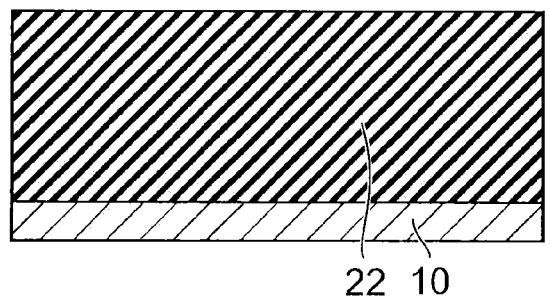
FIG. 12A to FIG. 13C are schematic cross-sectional views showing the manufacturing process of forming a capacitor in the peripheral region according to the second embodiment.

First, as shown in FIG. 12A, the insulating film 22 is formed on the semiconductor layer 10. The thickness of the insulating film 22 may be formed thicker than the thickness of the insulating film 21.

Figure 12B:
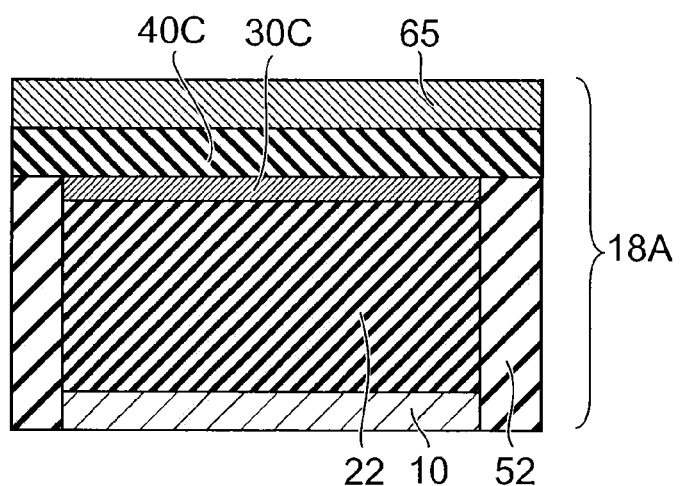

Next, as shown in FIG. 12B, the semiconductor-containing layer 30C is formed on the insulating film 22. Subsequently, the element isolation region 52 that surrounds the semiconductor-containing layer 30C is formed, the insulating film 40C is formed on the element isolation region 52 and on the semiconductor-containing layer 30C, and the conductive layer 65 is formed on the insulating film 40C. The structure in which the semiconductor layer 10, the insulating film 22, the semiconductor-containing layer 30C, the insulating film 40C, and the conductive layer 65 are stacked in this order is referred to as a stacked body 18A.

Figure 12C:
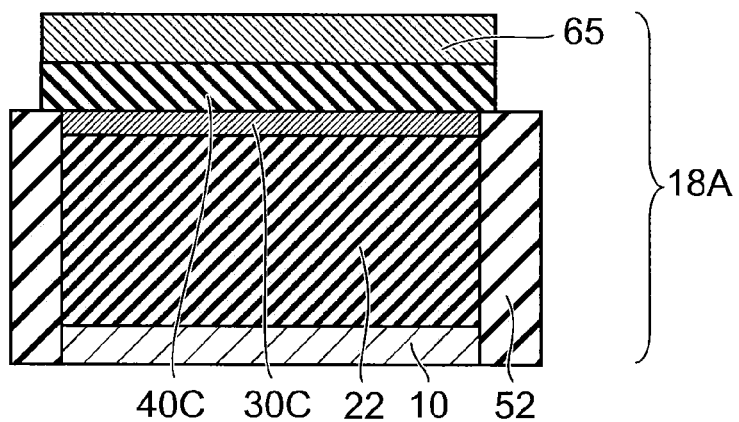

Next, as shown in FIG. 12C, photolithography and RIE processing are performed on the stacked body 18A to perform processing to such a degree that the width of the conductive layer 65 and the width of the insulating film 40C are almost the same as the width of the semiconductor-containing layer 30C.

Figure 13A:
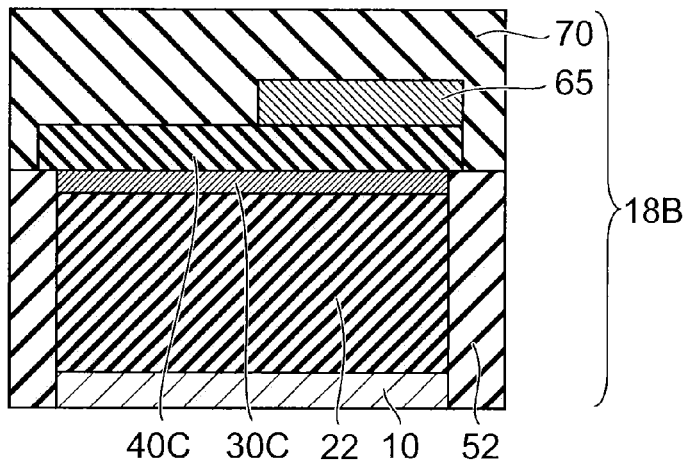

Next, as shown in FIG. 13A, photolithography and RIE processing are performed to reduce the width of the conductive layer 65 to expose part of the insulating film 40C from the conductive layer 65. Further, the insulating layer 70 that covers the element isolation region 52, the insulating film 40C, and the conductive layer 65 is formed. The structure in which the semiconductor layer 10, the insulating film 22, the semiconductor-containing layer 30C, the insulating film 40C, the conductive layer 65, and the insulating layer 70 are stacked in this order is referred to as a stacked body 18B.

Figure 13B:
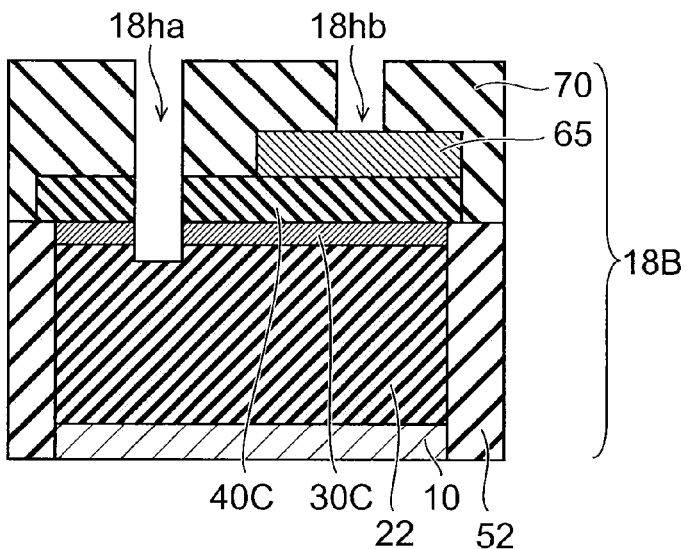

Next, as shown in FIG. 13B, photolithography and RIE processing are performed on the stacked body 18B to form a contact hole 18ha extending from the surface of the insulating layer 70 to the insulating film 22 and a contact hole 18hb reaching the conductive layer 65. Here, the contact hole 18hb is shallower than the contact hole 18ha. Thus, the contact hole 18hb reaches the conductive layer 65 earlier than the contact hole 18ha reaches the insulating film 22.

Here, as the etching gas, a gas whereby the etching rate of the conductive layer 65 is higher than the etching rate of the semiconductor-containing layer 30B and the insulating film 40B is selected. Therefore, even if the contact hole 18hb reaches the conductive layer 65 earlier, the conductive layer 65 is not etched thereafter and the contact hole 18ha reaches the insulating film 22.

Figure 13C:
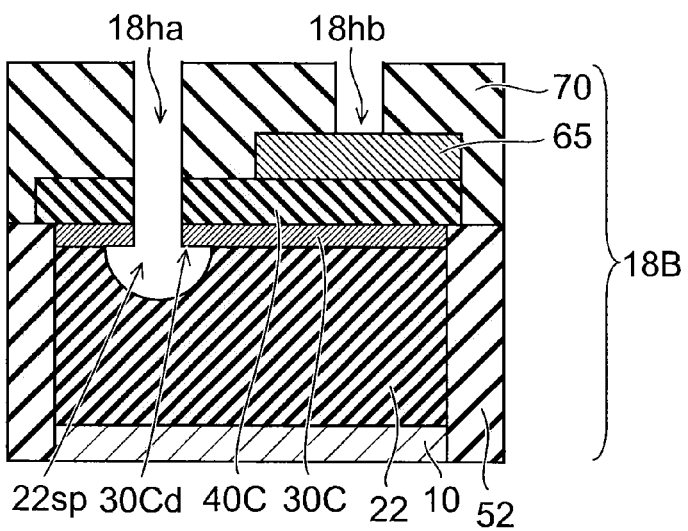

Next, as shown in FIG. 13C, a wet etching solution is introduced into the contact hole 18ha to perform isotropic etching on the surface of the insulating film 22 exposed at the contact hole 18ha. Here, a dilute hydrofluoric acid solution is used as the etching solution.

By the wet etching, the surface of the insulating film 22 exposed at the contact hole 18ha is selectively removed, and a space 22sp leading to the contact hole 18ha is formed on the lower side of the semiconductor-containing layer 30C. The space 22sp has a wider width than the contact hole 18ha. In the space 22sp, part of the lower surface 30Cd of the semiconductor-containing layer 30C is exposed.

After that, as shown in FIG. 9B, the conductive layers 83 and 84 are formed in the contact holes 18ha and 18hb, respectively. The formation of the conductive layers 83 and 84 is performed by CVD. The component of the conductive layers 83 and 84 is tungsten, for example.

Also in the second embodiment, the conductive layers 81 and 82 wrap around to the lower surface 30Bd of the semiconductor-containing layer 30B, and the conductive layers 81 and 82 are in contact not only with the side wall 30Bw of the semiconductor-containing layer 30B but also with the lower surface 30Bd of the semiconductor-containing layer 30B.

Therefore, in the resistance element according to the second embodiment, the contact area between the conductive layer 81 and the semiconductor-containing layer 30B and the contact area between the conductive layer 82 and the semiconductor-containing layer 30B are larger than those of the reference example. In the resistance element according to the second embodiment, the contact resistance between the conductive layer 81 and the semiconductor-containing layer 30B and the contact resistance between the conductive layer 82 and the semiconductor-containing layer 30B can be made lower than those of the reference example.

Furthermore, the conductive layer 83 wraps around to the lower surface 30Cd of the semiconductor-containing layer 30C, and the conductive layer 83 is in contact not only with the side wall 30Cw of the semiconductor-containing layer 30C but also with the lower surface 30Cd of the semiconductor-containing layer 30C.

Therefore, in the capacitor according to the second embodiment, the contact area between the conductive layer 83 and the semiconductor-containing layer 30C is larger than that of the reference example. Thereby, in the capacitor according to the second embodiment, the contact resistance between the conductive layer 83 and the semiconductor-containing layer 30C can be made lower than that of the reference example. In other words, in the second embodiment, for example, RC delay is suppressed by the reduction in the contact resistance mentioned above.

The thickness of the insulating film 22 is thicker than the thickness of the insulating film 21. Therefore, even if the conductive layer 83 is buried in the space 22sp, the thickness of the insulating film between the conductive layer 83 and the semiconductor layer 10 is thicker than that of the reference example because the insulation film 22 is formed thicker than the thickness of the insulating film 21. Thereby, in the second embodiment, dielectric breakdown is less likely to occur between the conductive layer 83 and the semiconductor layer 10.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
    a memory cell region; and
    a peripheral region disposed at a periphery of the memory cell region, the memory cell region including:
        a semiconductor layer including a plurality of semiconductor regions extending in a first direction, and the semiconductor layer being arranged in a direction crossing the first direction;
        a plurality of control gate electrodes provided on an upper side of the plurality of semiconductor regions, the control gate electrodes extending in a second direction crossing the first direction, and the control gate electrodes being arranged in a direction crossing the second direction;
        a first insulating film provided on a lower side of each of the plurality of control gate electrodes, and the first insulating film being in contact with the plurality of control gate electrodes;
        a semiconductor-containing layer provided at a crossing position of each of the plurality of semiconductor regions and the first insulating film, and the semiconductor-containing layer having a smaller thickness than the first insulating film; and
        a second insulating film provided between the semiconductor-containing layer and each of the plurality of semiconductor regions, the peripheral region including:
        the semiconductor layer;
        a third insulating film provided on the semiconductor layer;
        the semiconductor-containing layer provided on the third insulating film, and a periphery of the semiconductor-containing layer being surrounded by an element isolation region;
    the first insulating film provided on the semiconductor-containing layer; and
    a pair of conductive layers extending from a surface of the first insulating film to reach the third insulating film via the semiconductor-containing layer, and the pair of conductive layers being in contact with part of a lower horizontal surface of the semiconductor-containing layer.

2. The device according to claim 1, wherein the pair of conductive layers contain the same component as the control gate electrode.

3. The device according to claim 1, wherein the peripheral region further includes:
    a fourth insulating film provided on the semiconductor layer;
    an another semiconductor-containing layer provided on the fourth insulating film, and a periphery of the another semiconductor-containing layer being surrounded by an element isolation region;
    an another first insulating film provided on the another semiconductor-containing layer;
    a third conductive layer extending from a surface of the another first insulating film to reach the fourth insulating film via the another semiconductor-containing layer, and the third conductive layer being in contact with part of a lower surface of the another semiconductor-containing layer; and
    a fifth conductive layer provided on the another semiconductor-containing layer via the another first insulating film.

4. The device according to claim 3, wherein a film thickness of the fourth insulating film is thicker than a film thickness of the third insulating film.

5. The device according to claim 1, wherein a thickness of the semiconductor-containing layer is 10 nm or less.

6. The device according to claim 1, wherein the first insulating film is a single-layer film containing one of an oxide containing at least one of Si, Al, Hf, Zr, Ta, and La, a nitride containing at least one of Si, Al, Hf, Zr, Ta, and La, and an oxynitride containing at least one of Si, Al, Hf, Zr, Ta, and La, or a stacked film, and at least two of the single-layer film containing an oxide, the single-layer film containing a nitride, and the single-layer film containing an oxynitride are stacked in the stacked film.

7. The device according to claim 1, wherein a width of one of the conductive layers at the lower surface of the semiconductor-containing layer is larger than a width of the conductive layer at an upper surface of the semiconductor-containing layer.

8. The device according to claim 1, wherein an upper surface of one of the pair of the conductive layers is substantially flat.

* * * * *